(12) United States Patent
Matsumoto et al.

(10) Patent No.: US 6,287,430 B1
(45) Date of Patent: Sep. 11, 2001

(54) APPARATUS AND METHOD FORMING THIN FILM

(75) Inventors: Shigeharu Matsumoto; Kazuo Kikuchi, both of Tokyo; Yizhou Song, Kawaguchi; Takeshi Sakurai, Yokohama; Shinichiro Saisho, Tokyo, all of (JP)

(73) Assignee: Shincron Co., Ltd. (JP)

( * ) Notice: Subject to any disclaimer, the term of this patent is extended or adjusted under 35 U.S.C. 154(b) by 0 days.

(21) Appl. No.: 09/467,377

(22) Filed: Dec. 21, 1999

(51) Int. Cl.[7] .................................................. C23C 14/34
(52) U.S. Cl. .............................. 204/192.26; 204/192.12; 204/192.16; 204/192.22; 204/192.23; 204/298.23; 204/298.26; 204/298.28; 427/569; 427/574; 427/578; 427/579; 427/248.1; 427/255.23; 427/255.28; 118/723 MP; 118/719; 118/730
(58) Field of Search .......................... 204/192.1, 192.12, 204/192.16, 192.21, 192.22, 192.23, 192.26, 298.23, 298.26, 298.27, 298.28, 298.29; 427/569, 574, 575, 576, 578, 579, 248.1, 255.23, 255.28; 118/723 MP, 723 E, 719, 730

(56) References Cited

U.S. PATENT DOCUMENTS

| 4,268,711 | * | 5/1981 | Gurev ................................... 136/256 |
| 4,763,601 | * | 8/1988 | Saida et al. .......................... 118/718 |
| 4,851,095 | | 7/1989 | Scobey et al. .................. 204/192.12 |
| 5,169,509 | * | 12/1992 | Latz et al. ........................ 204/298.03 |
| 5,211,759 | * | 5/1993 | Zimmermann et al. ......... 118/723 R |
| 5,225,057 | | 7/1993 | Lefebvre et al. ................ 204/192.13 |
| 5,466,296 | * | 11/1995 | Misiano et al. ................ 118/723 MP |
| 5,618,388 | | 4/1997 | Seeser et al. .................... 204/192.12 |

FOREIGN PATENT DOCUMENTS

| 56-147829 | 11/1981 | (JP) . |
| 56-147830 | 11/1981 | (JP) . |
| 7-56001 | 3/1995 | (JP) . |
| 8-146358 | 6/1996 | (JP) . |
| 8-190002 | 7/1996 | (JP) . |
| 8-225932 | 9/1996 | (JP) . |
| 9-263937 | 10/1997 | (JP) . |

OTHER PUBLICATIONS

Vacuum, vol. 51, No. 4, pp. 525–550.
Journal of Vacuum Science & Technology A, Second Series, vol. 15, No. 5, Sep./Oct. 1997, pp. 2670–2672.
ISSP, 1999, pp. 195–196, Jun. 16–18, 1999, Song et al.
Thin Solid Films, 334 (1998) 92–97.

* cited by examiner

*Primary Examiner*—Rodney McDonald
(74) *Attorney, Agent, or Firm*—Lorusso & Loud

(57) ABSTRACT

The present invention is drawn to an apparatus for forming a thin film. The apparatus includes a vacuum chamber; a vacuum apparatus connected to the vacuum chamber; a holder placed in the vacuum chamber, which holder holds a substrate and is rotated by means of a rotating mechanism; a plasma CVD apparatus; and a sputtering apparatus, wherein the plasma CVD apparatus and the sputtering apparatus are placed in a single vacuum chamber and a thin film having an medium refractive index is formed on the substrate held by the holder, by means of the plasma CVD apparatus and the sputtering apparatus. The method making use of such an apparatus is also disclosed.

23 Claims, 13 Drawing Sheets

Reflective Index Control through Monomer Flow Rate

Reflective Index Control through sputtering Power

APPARATUS AND METHOD FORMING THIN FILM

BACKGROUND OF THE INVENTION

1. Field of the Invention

The present invention relates to an apparatus and method for forming a thin film. More particularly, the invention relates to an apparatus and method for forming, on a plastic substrate, a thin film having improved scratch resistance, an medium refractive index, and strong adhesion to the substrate.

2. Background Art

Conventionally, a variety of techniques have been known for forming a hard coating film on a plastic substrate.

For example, an organic silicone coating film has been formed on a plastic lens by dipping to serve as a hard coating film. In order to adapt to a recent plastic lens per se having a high refractive index, a silicone coating film having a corresponding refractive index must be developed. Such a coating film is formed by use of an apparatus which enables provision of a specific refractive index in the formed coating film. Therefore, a facility for producing the coating film must disadvantageously be equipped with a plurality of dipping apparatus.

When a hard coating film is formed by use of a conventional dipping apparatus, a substrate must be subjected to a surface pretreatment, such as immersion in an alkaline solution. In view of environmental safety, the process requires an additional treatment, such as treatment of wastewater. In addition, a conventional method for forming a hard coating film requires a condensation-curing step requiring several hours. Thus, solving these problems is very important for saving time until product delivery.

In order to solve these problems, a variety of techniques are proposed. For example, Japanese Patent Application Laid-Open (kokai) No. 8-190002 discloses a method for coating an optical material substrate through plasma polymerization. The method comprises a step for controlling the refractive index of the coating film by controlling the composition of a polymerization atmosphere and/or controlling at least one process parameter for coating the substrate through plasma polymerization, such that the refractive index varies non-stepwise from the initial value at the top of the substrate to a final value at the top surface of the coating film.

Japanese Patent Application Laid-Open (kokai) No. 8-146358 discloses a method for coating. The method comprises transforming into gas, under reduced pressure in a chamber, an organic titanium compound having an alkoxyl group and an organic silicon compound having an alkoxyl group serving as monomers; introducing the gas into a chamber containing plasma under reduced pressure to thereby cause plasma reaction; depositing the thus-formed compounds on a substrate while modifying the refractive index of the formed thin film to thereby form an intermediate matching layer on the substrate; and forming a thin film comprising an organic silicon compound having an alkoxyl group on the matching layer. In the method, an anti-reflection film and an optional water-repellent thin film comprising an organic fluorocompound and/or an organic silicon compound are further formed.

Japanese Patent Application Laid-Open (kokai) No. 7-56001 discloses a hard coating film and a method for forming the film. Specifically, there are disclosed a hard coating layer formed on a plastic substrate wherein the refractive index at the portion contacting the plastic substrate is approximately equal to that of the plastic substrate and the refractive index gradually or stepwise varies with respect to the thickness direction, and an anti-reflection film formed on the hard coating layer. In addition, a method is disclosed for forming a hard coating layer and an anti-reflection layer on a plastic substrate so as to mechanically protect the plastic substrate and impart an anti-reflection function to the substrate. The method comprises forming a hard coating layer wherein the refractive index gradually or stepwise varies with respect to the thickness direction such that the refractive index at the portion contacting the plastic substrate is approximately equal to that of the plastic substrate and the top surface of the hard coating film has a predetermined refractive index for designing a coated product. The method further comprises forming on the hard coating layer an anti-reflection film which is designed on the basis of the predetermined refractive index.

Furthermore, a variety of other techniques are also proposed. For example, Japanese Patent Application Laid-Open (kokai) No. 56-14789 discloses a method for forming a hard coating film, which method comprises feeding an organic monomer or polymer into a chamber in which a plastic substrate is placed; ionizing the monomer or polymer by plasma to form an organic polymer layer on the plastic substrate; and vapor-depositing an inorganic hard substance while continuing formation of the polymer layer to thereby form an organic-inorganic composite layer. Japanese Patent Application Laid-Open (kokai) No. 56-147830 discloses a method for forming a hard coating film, which method comprises feeding an organic monomer or polymer into a chamber in which a plastic substrate is placed; ionizing the monomer or polymer by plasma to form an organic polymer layer on the plastic substrate; vapor-depositing an inorganic hard substance while continuing formation of the polymer layer to thereby form an organic-inorganic composite layer; and subsequently vapor-depositing an inorganic hard substance so as to form an inorganic hard layer.

As described above, there have been known techniques for forming an $SiO_2$ or $SiO_2$ composite film through direct plasma CVD, with products attaining high temperature due to employment of plasma; techniques for making the refractive index at the top surface of a thin film constant by use of a refractive index-graded film which matches any substrate; and techniques for forming a hard coating film through combination of CVD (plasma polymerization) and vapor deposition.

An $SiO_2$ film having a refractive index of approximately 1.46 can be easily and reliably formed through any one of these methods. However, satisfactory, industrial-scale production of a film having a higher refractive index with a constant refractive index at the top surface of a thin film through plasma CVD or by use of a refractive index-graded film which matches any substrate has not been attained thus far, due to restriction of a production apparatus and fabrication of a production apparatus.

Specifically, when direct plasma CVD is employed, stable operation of a CVD apparatus while constant component proportions of gasified materials are maintained is difficult, due to difficulty in flow control of a monomer serving as a $TiO_2$ source among two categories of gasified substances. In other words, the process requires long-term, stable operation in a production line and a control apparatus for stably gasifying a liquid or solid CVD source.

Low-temperature film formation is preferred during production of a hard coating film through combination of direct plasma CVD (plasma polymerization) and vapor deposition. In addition, when direct plasma CVD is employed, control of plasma must be considered in order to form a film at low temperature.

SUMMARY OF THE INVENTION

In view of the foregoing, an object of the present invention is to provide an apparatus for forming, on a plastic substrate, a hard coating thin film having improved scratch resistance, an medium refractive index, and strong adhesion to the substrate.

Another object of the invention is to provide an apparatus for forming a thin film having an medium refractive index at low temperature and ensuring long-term, stable operation and reproducibility.

Yet another object of the invention is to provide a method for forming the thin film.

Accordingly, the present invention provides an apparatus for forming a thin film comprising a vacuum chamber; a vacuum apparatus connected to the vacuum chamber; a holder placed in the vacuum chamber, which holder holds a substrate and is rotated by means of a rotating mechanism; a plasma CVD apparatus; and a sputtering apparatus, wherein the plasma CVD apparatus and the sputtering apparatus are placed in a single vacuum chamber and a thin film having an medium refractive index is formed on the substrate held by the holder, by means of the plasma CVD apparatus and the sputtering apparatus.

Preferably, the apparatus is a parallel-plane-type, drum-type, rotary-drum-type, or dome-type apparatus.

Preferably, regions of the CVD apparatus and the sputtering apparatus are separated by a partition.

Preferably, the plasma CVD apparatus comprises a plasma source, a mass flow controller for feeding a monomer, an electric power source comprising a matching box connected to a high-frequency electric power source, and a mass flow controller for feeding a reactive gas, wherein an organic silicon compound serving as a monomer is activated in a portion apart from the plasma source in a plasma atmosphere, to thereby form on the substrate a thin film having a low refractive index.

Preferably, the sputtering apparatus quantitatively feeds particles having a predetermined, high refractive index onto the thin film formed by means of the plasma CVD apparatus.

Preferably, a target wall is formed around a target and a gas-supplying portion contained in the sputtering apparatus.

Preferably, the sputtering apparatus employs at least two different kinds of sputtering targets.

Preferably, the plasma CVD apparatus is a remote plasma CVD apparatus and the sputtering apparatus is a vapor deposition apparatus.

Preferably, the substrate is formed of plastic material.

Preferably, the plasma source is selected from among diatomic oxygen ($O_2$), dinitrogen oxide ($N_2O$), and ozone ($O_3$).

The present invention also provides a method for forming a thin film, which method comprises a step of forming a thin film having a low refractive index through plasma CVD and a step of quantitatively feeding particles of high refractive index through sputtering, the two steps being carried out simultaneously in a single chamber at positions different from one another, to thereby form on the substrate a thin film having a medium refractive index.

The present invention also provides a method for forming a thin film, which method comprises a step of forming a thin film having low refractive index, through plasma CVD attained by activating an organic silicon compound as a monomer in a plasma atmosphere, and a step of quantitatively feeding, through sputtering, particles comprising a metal oxide or a multi-component metal oxide and of high refractive index, the two steps being carried out simultaneously in a single chamber at positions different from one another, to thereby form on the substrate a thin film having an medium refractive index.

Preferably, sputtering is carried out by use of at least two different kinds of sputtering targets.

Preferably, plasma CVD is carried out through remote plasma CVD and sputtering is carried out through vapor deposition.

Preferably, the organic silicon compound comprises an organic silane, an alkoxysilane, a siloxane, or a halosilane.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
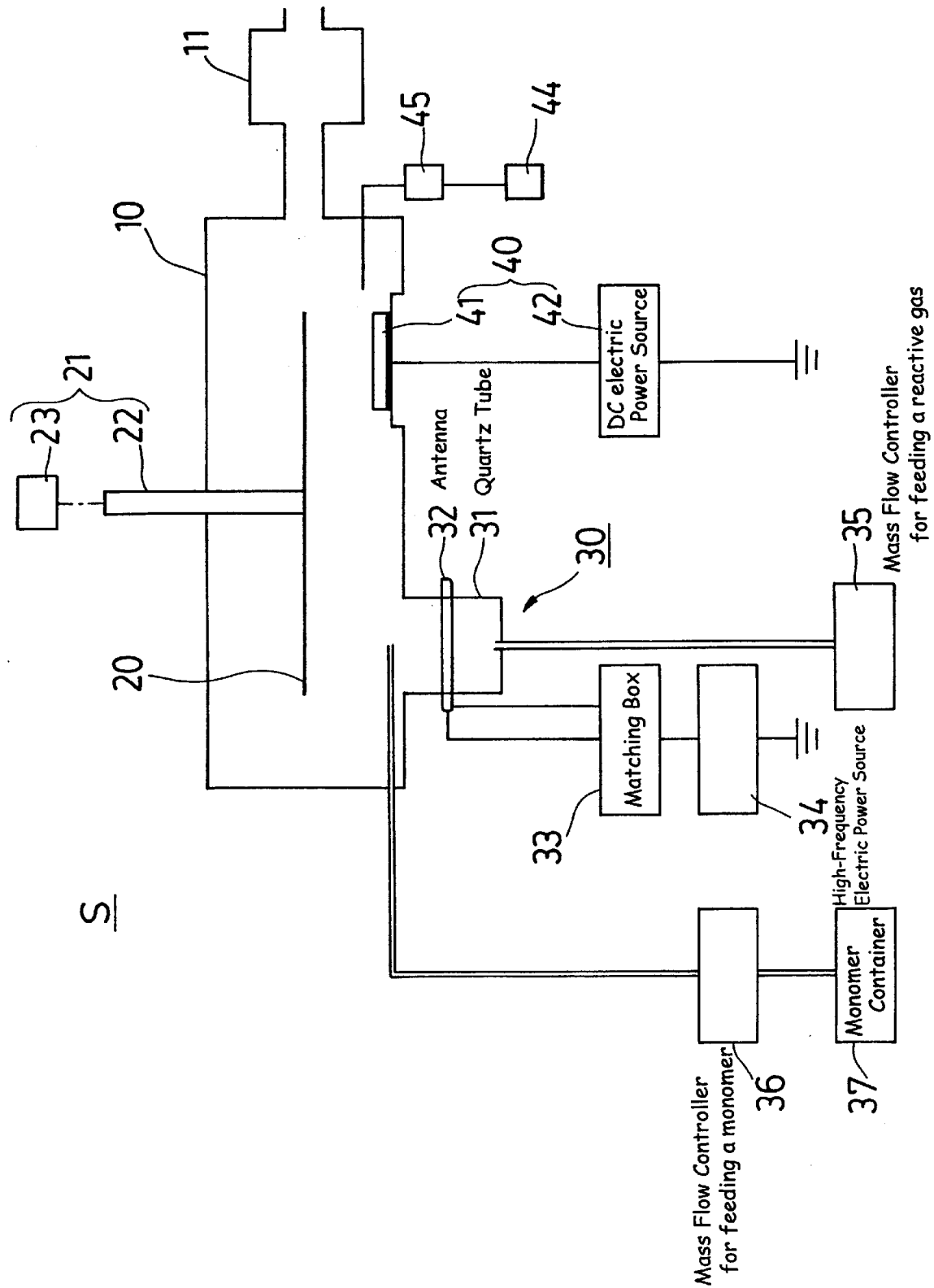
FIG. 1 is a schematic view of an apparatus for forming a thin film according to the present invention.

An apparatus S for forming a thin film comprises a vacuum chamber 10; a vacuum pump 11 connected to the vacuum chamber 10; a holder 20 placed in the vacuum chamber 10, which holder holds a substrate; a rotating mechanism 21 which rotates the holder 20; a plasma CVD apparatus 30, and a sputtering apparatus 40. In the apparatus S, the plasma CVD apparatus 30 and the sputtering apparatus 40 are placed in the single vacuum chamber 10 and a thin film having an medium refractive index is formed on the substrate held by the holder 20, by means of the plasma CVD apparatus 30 and the sputtering apparatus 40.

The plasma CVD apparatus 30 comprises a plasma source (a quartz tube 31 and an antenna 32); a mass flow controller 36 for feeding a monomer; an electric power source comprising a matching box 33 and a high-frequency electric power source 34 connected to the matching box 33; and a mass flow controller 35 for feeding a reactive gas, wherein an organic silicon compound serving as a monomer is activated in a portion apart from the plasma source in a plasma atmosphere, to thereby form on the substrate a thin film of low refractive index.

The sputtering apparatus 40 quantitatively feeds particles of a predetermined, high refractive index onto the thin film formed by means of the plasma CVD apparatus 30. In addition, the plasma CVD apparatus 30 may be a remote plasma CVD apparatus and the sputtering apparatus 40 may be a vapor deposition apparatus.

Examples of organic silicon compounds which serve as the CVD sources used in the invention include organic silanes having a group such as an alkyl group, an allyl group, a vinyl group, or a phenyl group, e.g., tetramethylsilane $(Si(CH_3)_4)$, tetraethylsilane $(Si(C_2H_5)_4)$, ethyltrimethylsilane $(Si(C_2H_5)(CH_3)_3)$, allyltrimethylsilane $((CH_2=CHCH_2)Si(CH_3)_4)$, phenyltrimethylsilane $((C_6H_5)Si(CH_3)_3)$, and hexamethyldisilane $((CH_3)_3SiSi(CH_3)_3)$; alkoxysilanes such as tetramethoxysilane $(Si(OCH_3)_4)$, tetraethoxysilane $(Si(OC_2H_5)_4)$, dimethyldiethoxysilane $(Si(CH_3)_2(OC_2H_5)_2)$, and ethoxytrimethylsilane $(Si(OC_2H_5)(CH_3)_3)$; siloxanes such as hexamethyldisiloxane $((CH_3)_3SiOSi(CH_3)_3)$ and octamethyltrisiloxane $((CH_3)_3SiOSi(CH_3)_2OSi(CH_3)_3)$; and halosilanes such as tetrachlorosilane $(SiCl_4)$. Examples of plasma sources include diatomic oxygen $(O_2)$, dinitrogen oxide $(N_2O)$, and ozone $(O_3)$.

As described above, according to the present invention, sources that are respectively carrying different refractive index are simultaneously formed through CVD and sputtering, respectively, to thereby provide the effects described below. Since $SiO_2$ film formed through sputtering has high compressive stress, to thereby provide stress to a substrate, employment of CVD, which provides a thin film having low stress, mitigates the stress and can be applied for forming a hard coating film. In addition, in the present invention, arcing of silicon is prevented since sputtering and oxidation are carried out in portions separated from one another. Thus, control of plasma may be omitted.

The present invention enables provision, on a plastic substrate, of a thin hard coating film having improved scratch resistance, an medium refractive index, and strong adhesion to the plastic substrate. The adhesion is enhanced by incorporation of a refractive index-graded layer to the thin film, and the refractive index can be adjusted from 1.46 $(SiO_2)$ to 2.22.

Other advantages of the present invention include formation of a hard thin film, high film-forming rate, and high controllability of film properties. Furthermore, a rugate filter, a multi-layer film, and a thin film of high refractive index and density can also be produced according to the present invention.

As described hereinabove, according to the apparatus for forming a thin film and the method for forming a thin film of the present invention, there is provided on a plastic substrate a thin hard coating film having improved scratch resistance, an medium refractive index, and strong adhesion to the plastic substrate. In addition, a thin film having an medium refractive index can be formed at low temperature and a long-term, stable operation and reproducibility are ensured.

EMBODIMENTS

The present invention will next be described with reference to the drawings. The below-described parts and locations should not be construed as limiting the invention thereto, and a multitude of variations are encompassed by the scope of the invention.

FIG. 1 is a schematic view of an embodiment of the apparatus for forming a thin film according to the present invention. The apparatus S for forming a thin film comprises, as primary components, a vacuum chamber 10, a holder 20, a plasma CVD apparatus 30, and a sputtering apparatus 40.

The apparatus S further comprises a vacuum pump 11, which is connected to the vacuum chamber 10. The holder 20, which can rotate, is disposed within the vacuum chamber 10 at an approximately center position of the chamber 10. In the chamber, the plasma CVD apparatus 30 and the sputtering apparatus 40 are disposed such that each opposingly faces the holder 20.

The apparatus S further comprises a rotating mechanism 21, which rotates the holder 20. The holder 20 holds a substrate in the chamber 10, has a disk shape, and has a holding portion on the surface for holding a substrate (not shown). The holding portion defines a hole and the substrate is held in the hole. The holder 20 is connected to a rotation shaft 22, which is connected to a rotating apparatus 23, such as a motor disposed outside of the vacuum chamber 10. The rotation shaft 22 and the rotating apparatus 23 constitute the rotating mechanism 21.

In the embodiment, a remote plasma CVD apparatus 30 is employed. Accordingly, the remote plasma CVD apparatus comprises a quartz tube 31, an antenna 32, a matching box 33, a high-frequency electric power source 34, a mass flow controller 36 for feeding a monomer, a monomer container 37, and a mass flow controller 35 for feeding a reactive gas.

Accordingly, in the plasma CVD apparatus of this embodiment; i.e., the remote plasma CVD apparatus, the antenna is wound around the outer periphery of the quartz tube 31, to thereby connect the antenna 32 and the matching box 33. The matching box 33 is connected to the high-frequency electric power source 34. The quartz tube 31 is connected to the mass flow controller 35 for feeding a reactive gas via a tube.

In the vacuum apparatus 10, at a position close to the quartz tube 31 but apart from a certain distance therefrom, an organic silicon compound serving as a monomer is supplied. The monomer is supplied from a tube connected to the mass flow controller 36 for feeding a monomer, and the monomer is fed from the monomer container 37 through the mass flow controller 36. In the embodiment, an organic silicon compound and oxygen are used as a monomer and a reactive gas, respectively.

The sputtering apparatus 40 of this embodiment comprises a target 41 disposed in the vacuum chamber 10 and a DC electric power source 42 connected to the target 41. In the embodiment, a metal such as Zr, Ta, or Ti is used as the target material 41, and DC current is supplied to the target 41.

In addition, a gas such as Ar is fed to the atmosphere surrounding the target 41. The Ar gas is fed from a gas reservoir 44 via the mass flow controller 45.

Although DC current is employed in the embodiment, a technique making use of a high-frequency electric power source may also be employed, when the target 41 is formed of a metal oxide such as $ZrO_2$, $Ta_2O_5$, or $TiO_2$.

By use of the above-described apparatus S for forming a thin film, a thin film is formed on the substrate by means of the plasma CVD apparatus 30, and particles are sputtered onto the thus-formed thin film by means of the sputtering apparatus 40. Accordingly, in a first step, a thin film of low refractive index is formed through plasma CVD and in a second step, particles of high refractive index are quantitatively fed through sputtering. These two steps are carried out simultaneously in a single chamber at positions different from one another, to thereby form on the substrate a thin film having an medium refractive index. The sequence in which a substrate is subjected to the two steps may be changed.

More specifically, in a first step, a thin film having low refractive index is formed through plasma CVD by activating an organic silicon compound serving as a monomer in a plasma atmosphere, and in a second step, particles comprising a metal oxide or a multi-component metal oxide and having high refractive index are quantitatively fed through sputtering. These two steps are carried out simultaneously in a single chamber at positions different from one another, to thereby form on the substrate a-thin film having an medium refractive index. In this case also, the sequence in which a substrate is subjected to the two step may be changed.

Thus, according to the above-described procedure, the refractive index of a thin film formed through combination of plasma CVD and sputtering can be controlled, and therefore, a thin film having a refractive index of 1.46–2.22 can be formed on a substrate.

The working examples of formation of thin films according to the above-mentioned apparatus and method are shown in TABLEs 1 and 2. The apparatus employed in the working examples has a width of 1400 mm and a height of 400 mm, and the employed holder has a diameter of 1200 mm. The substrate was made of optical glass (BK-7). Other parameters are shown in TABLEs 1 and 2.

TABLE 1

| No | Target | Ultimate Pressure (Pa) | Revolutions (rpm) | Depositing Pressure (Pa) | Flow Rate of Argon Gas (sccm) | Making Electric Power (kw) | Voltage (v) | Electric Currunt (A) | $O_2$ Flow Rate (sccm) |
|---|---|---|---|---|---|---|---|---|---|
| 1 | Ta φ6" | $2.4 \times 10^{-4}$ | 100 | $7.0 \times 10^{-2}$ | 100 | 2.0 | 603 | 3.96 | 200 |
| 2 | Ta φ6" | $4.0 \times 10^{-4}$ | 100 | $5.3 \times 10^{-2}$ | 100 | 1.0 | 530 | 2.26 | 150 |
| 3 | Ta φ6" | $4.4 \times 10^{-4}$ | 100 | $6.4 \times 10^{-2}$ | 100 | 1.5 | 664 | 3.20 | 200 |
| 4 | Ta φ6" | $1.3 \times 10^{-3}$ | 100 | $4.0 \times 10^{-2}$ | 100 | 1.5 | 564 | 3.22 | 200 |
| 5 | Ta φ6" | $1.5 \times 10^{-3}$ | 100 | $3.3 \times 10^{-1}$ | 100 | 1.5 | 562 | 3.23 | 200 |
| 6 | Ta φ6" | $1.8 \times 10^{-3}$ | 100 | $4.6 \times 10^{-1}$ | 100 | 1.5 | 561 | 3.19 | 200 |

| No | Monomer Flow rate (sccm) | Coil Current (A) | RF Electric Power (kw) | Film Depositing Time (min) | Film Width (nm) | Reflective Index (550 nm) | Extinction Coefficient (550 nm) |
|---|---|---|---|---|---|---|---|
| 1 | 13 | 0 | 3 | 15 | 392.6 | 1.77 | $3.53 \times 10^{-4}$ |
| 2 | 13 | 0 | 3 | 30 | 528.4 | 1.578 | $3.16 \times 10^{-4}$ |
| 3 | 13 | 0 | 3 | 15 | 326.6 | 1.665 | $6.85 \times 10^{-4}$ |
| 4 | 7 | 0 | 3 | 30 | 629.1 | 1.732 | $3.94 \times 10^{-4}$ |
| 5 | 25 | 0 | 3 | 15 | 464.5 | 1.5866 | $2.069 \times 10^{-4}$ |
| 6 | 35 | 0 | 3 | 15 | 594.3 | 1.5737 | $6.154 \times 10^{-4}$ |

TABLE 2

| No | Target | Ultimate Pressure (Pa) | Revolutions (rpm) | Depositing Pressure (Pa) | Flow Rate of Argon Gas (sccm) | Making Electric Power (kw) | Voltage (v) | Electric Currunt (A) | $O_2$ Flow Rate (sccm) |
|---|---|---|---|---|---|---|---|---|---|
| 1 | Ta φ6" | $3.0 \times 10^{-3}$ | 100 | $2.0 \times 10^{-1}$ | 100 | 0.5 | 416 | 1.46 | 150 |
| 2 |  | $1.6 \times 10^{-3}$ | 100 | $7.8 \times 10^{-2}$ | 50 |  |  |  | 200 |
| 3 | Ta φ6" | $1.3 \times 10^{-3}$ | 100 | $8.0 \times 10^{-2}$ | 100 | 1.5 | 600 | 3.00 | 150 |
| 4 | Ta φ6" | $1.4 \times 10^{-3}$ | 100 | $6.3 \times 10^{-2}$ | 100 | 3.0 | 640 | 5.64 | 150 |

| No | Monomer Flow rate (sccm) | Coil Current (A) | RF Electric Power (kw) | Film Depositing Time (min) | Film Width (nm) | Reflective Index (550 nm) | Extinction Coefficient (550 nm) |
|---|---|---|---|---|---|---|---|
| 1 | 13 | 0 | 3 | 15 | 238.7 | 1.4981 (485 nm) | $7.94 \times 10^{-4}$ |
| 2 | 7 | 0 | 3 | 30 | 302.6 | 1.498 (592 nm) | $6.129 \times 10^{-4}$ |
| 3 | 13 | 0 | 3 | 15 | 325.7 | 1.6829 | $1.136 \times 10^{-3}$ |

TABLE 2-continued

| | | | | | | | |
|---|---|---|---|---|---|---|---|
| 4 | 13 | 0 | 3 | 15 | 502.6 | 1.8474 (426 nm) (528 nm) | $1.315 \times 10^{-2}$ |

Figure 13:
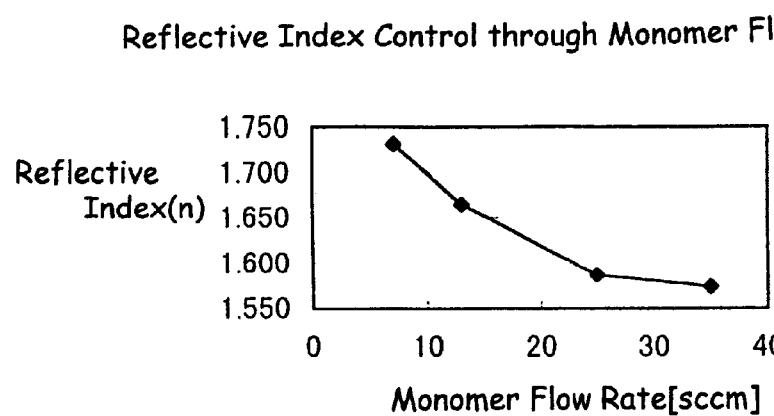
FIG. 13 is a graph showing control of refractive index by means of changing the flow rate of a monomer.
Figure 14:
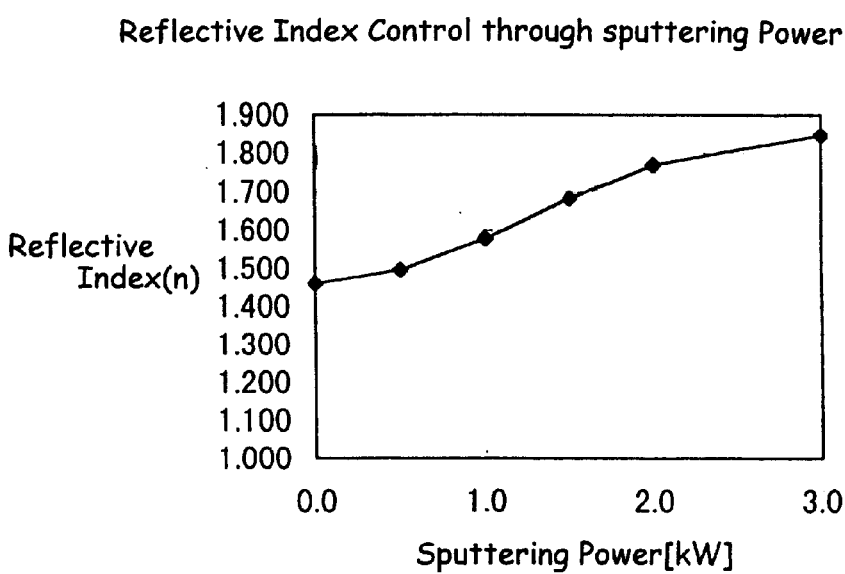
FIG. 14 is a graph showing control of refractive index by means of changing the sputtering electric power.

FIGS. 13 and 14 are graphs corresponding to the results of TABLEs 1 and 2, respectively. As is clear from FIGS. and TABLEs, the refractive index of the formed thin films can be controlled through control of the sputtering power at a constant flow rate of a monomer or control of the flow rate of a monomer at a constant sputtering power.

Next, the film forming apparatus of the present invention which is capable of providing a film of medium refractive index will be described with reference to FIGS. 2 through 11. In the following descriptions, members corresponding to those shown in FIG. 1 are labeled with the same reference numerals as in FIG. 1. Also, for the sake of simplicity and convenience, an oxide is taken as an example. FIGS. 2 through 8 relate to a parallel-plane-type apparatus, FIGS. 9 and 10 relate to a rotary-drum-type apparatus, FIG. 11 relates to a dome-type apparatus, and FIG. 12 relates to a drum-type apparatus.

Figure 2:
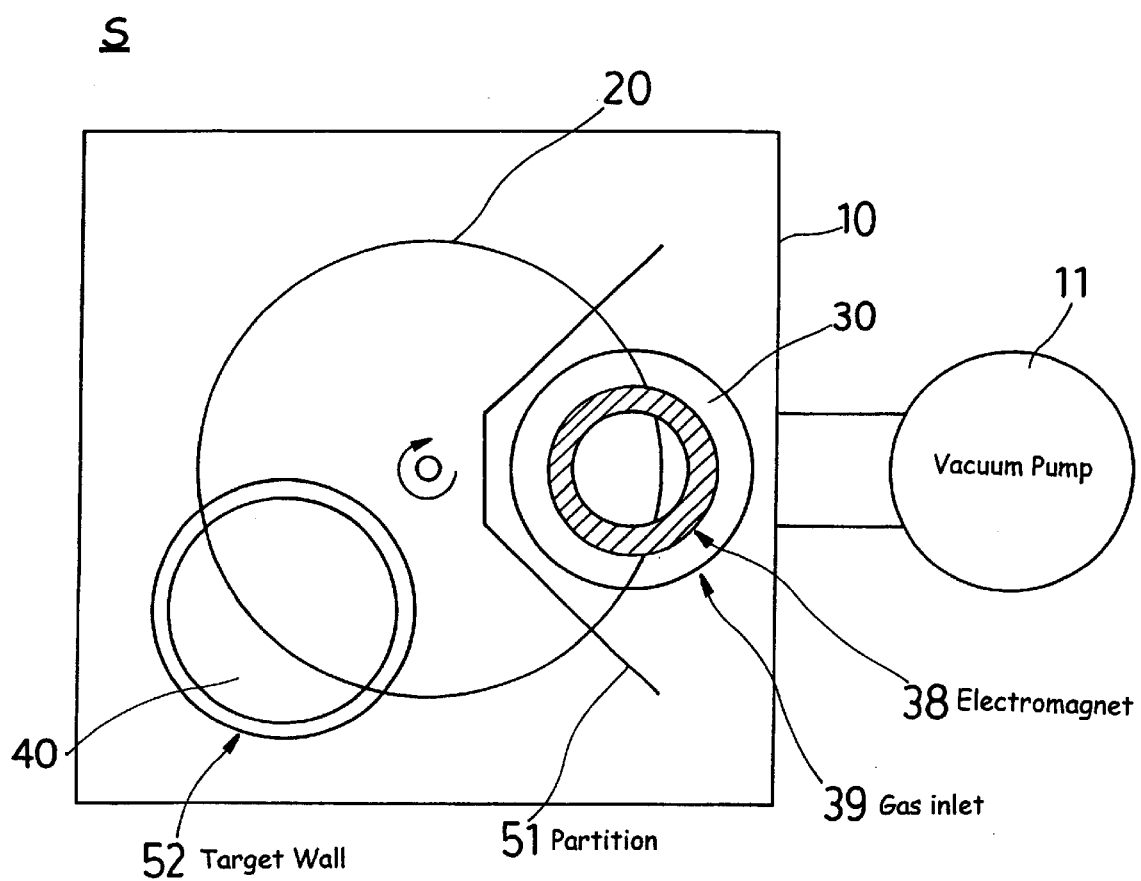
FIG. 2 is a schematic plane view of a parallel-plane-type apparatus for forming a thin film according to the present invention employing a CVD apparatus and a DC sputtering apparatus.
Figure 3:
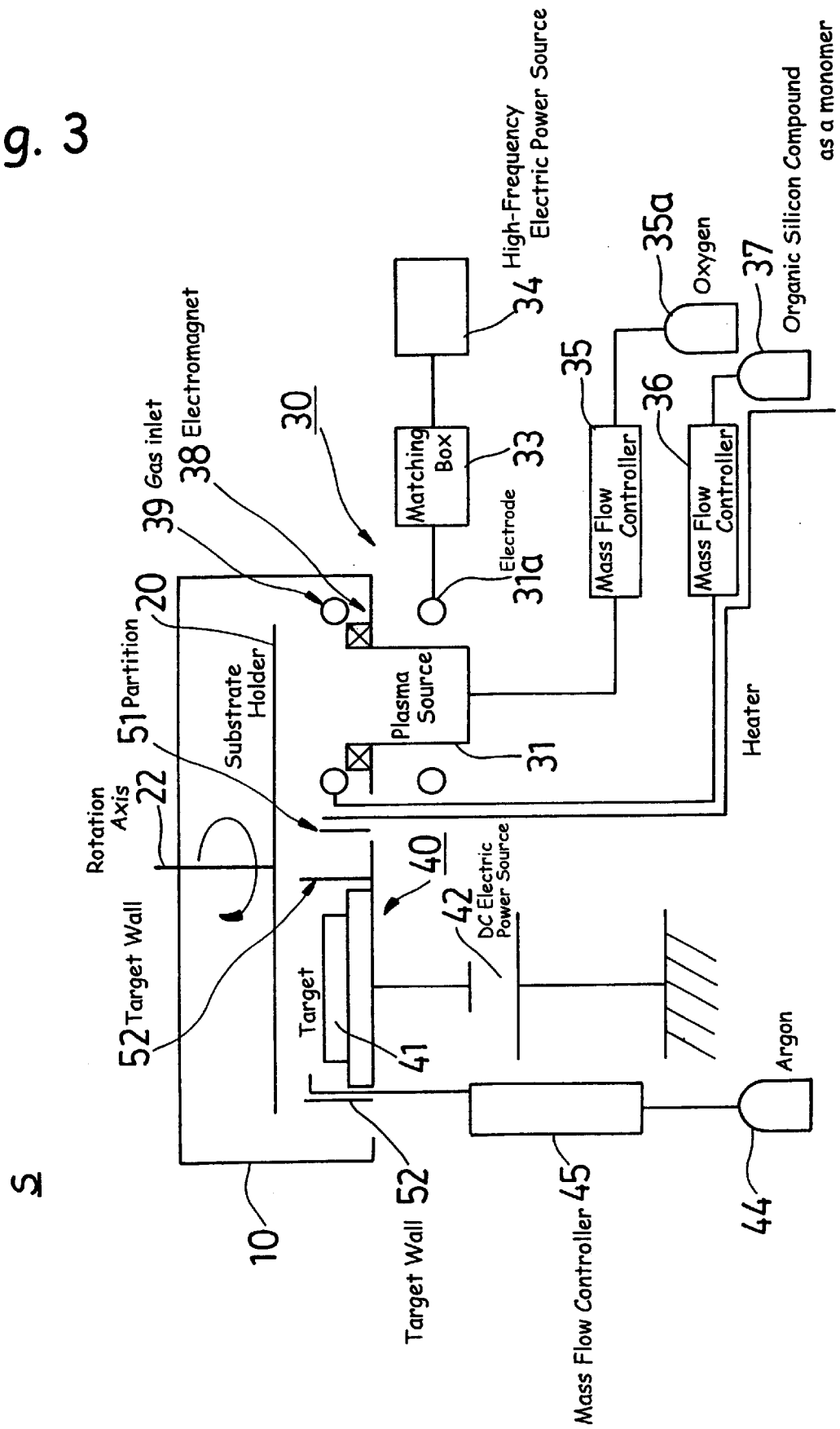
FIG. 3 is a schematic sectional view of the apparatus for forming a thin film shown in FIG. 2.

FIGS. 2 and 3 show an embodiment of the parallel-plane type film-forming apparatus, in which a CVD apparatus and a DC sputtering apparatus are used in combination. FIG. 2 shows a schematic plan view of the thin-film forming apparatus, and FIG. 3 shows a schematic cross section of the apparatus. The monomer used in the thin-film forming apparatus S of the present embodiment is TEOS (tetraethoxysilane), which is an alkoxysilane, and the target material employed may be, among others, Si, Ta, Ti, Zr, Hf, Al, or Nb. The apparatus S primarily comprises a vacuum chamber 10; a holder 20 placed in the vacuum chamber 10 and holding a substrate; a plasma CVD apparatus 30; and a sputtering apparatus 40. Thus, so far as these components are concerned, the structure of the apparatus per se is identical with that of the embodiment shown in FIG. 1.

The apparatus S further comprises a vacuum pump 11, which is connected to the vacuum chamber 10. The holder 20, which can rotate, is disposed within the vacuum chamber 10 at approximately the center position of the chamber 10. In the vacuum chamber 10, the plasma CVD apparatus 30 and the sputtering apparatus 40 are disposed such that each opposingly faces the holder 20. In the vacuum chamber 10, the plasma CVD apparatus 30 and the sputtering apparatus 40 are located apart from each other. In the present embodiment, as shown in FIG. 2, the plasma CVD apparatus 30 and the sputtering apparatus 40 are disposed such that a line joining the plasma CVD apparatus 30 with the rotation axis and a line joining the sputtering apparatus 40 and the rotation axis form an angle of 90° or more.

The vacuum chamber 10 also contains, at the outer periphery of a plasma source, an electromagnet 38 for effecting diffusion of plasma. A gas inlet 39 is provided around the electromagnet 38. In the vacuum chamber 10, a partition 51 is provided so as to surround the plasma CVD apparatus 30. The partition 51 prevents diffusion of the organic silicon compound toward the target.

The structure of the substrate holder 20 in the present embodiment is the same as that shown in FIG. 1. The plasma CVD apparatus 30 of the present embodiment assumes the form of a remote plasma CVD apparatus. That is, the remote plasma CVD apparatus comprises, as primary components, a quartz tube 31, an electrode 31a, a matching box 33, a high-frequency electric power source 34, a mass flow controller 36 for feeding a monomer, a monomer container 37, a mass flow controller 35 for feeding a reactive gas, and a reaction gas container 35a connected to the mass flow controller 35 (in the present embodiment, the reaction gas is oxygen).

The plasma CVD apparatus 30 according to the present embodiment (i.e., a remote plasma CVD apparatus) includes an electrode 31a which surrounds the quartz tube 31 and is connected to the matching box 33. The matching box 33 is connected to the high-frequency electric power source 34. The quartz tube 31 is connected to the mass flow controller 35 for reaction gas and then to the reaction gas container 35a by the mediation of a tube.

In the vacuum apparatus 10, an organic silicon compound serving as a monomer is supplied at a position close to the quartz tube 31—in the present embodiment, through a gas inlet 39 around the electromagnet 38 for effecting diffusion of plasma. The monomer is supplied from a tube connected to the mass flow controller 36 for feeding a monomer at high temperature (i.e., by use of a heater), and the monomer is fed from the monomer container 37 through the mass flow controller 36. In the present embodiment, an organic silicon compound and oxygen are used as a monomer and a reactive gas, respectively.

Like the case shown in FIG. 1, the sputtering apparatus 40 of the present embodiment comprises a target 41 disposed in the vacuum chamber 10, and argon gas is supplied through a mass flow controller 45 from a gas container 44. At the outer periphery of the supply portion, a target wall 52 is provided. The target wall 52 functions to retain the argon gas within a certain surrounding area of the target, to thereby substantially avoid any influence to the CVD apparatus.

Figure 4:
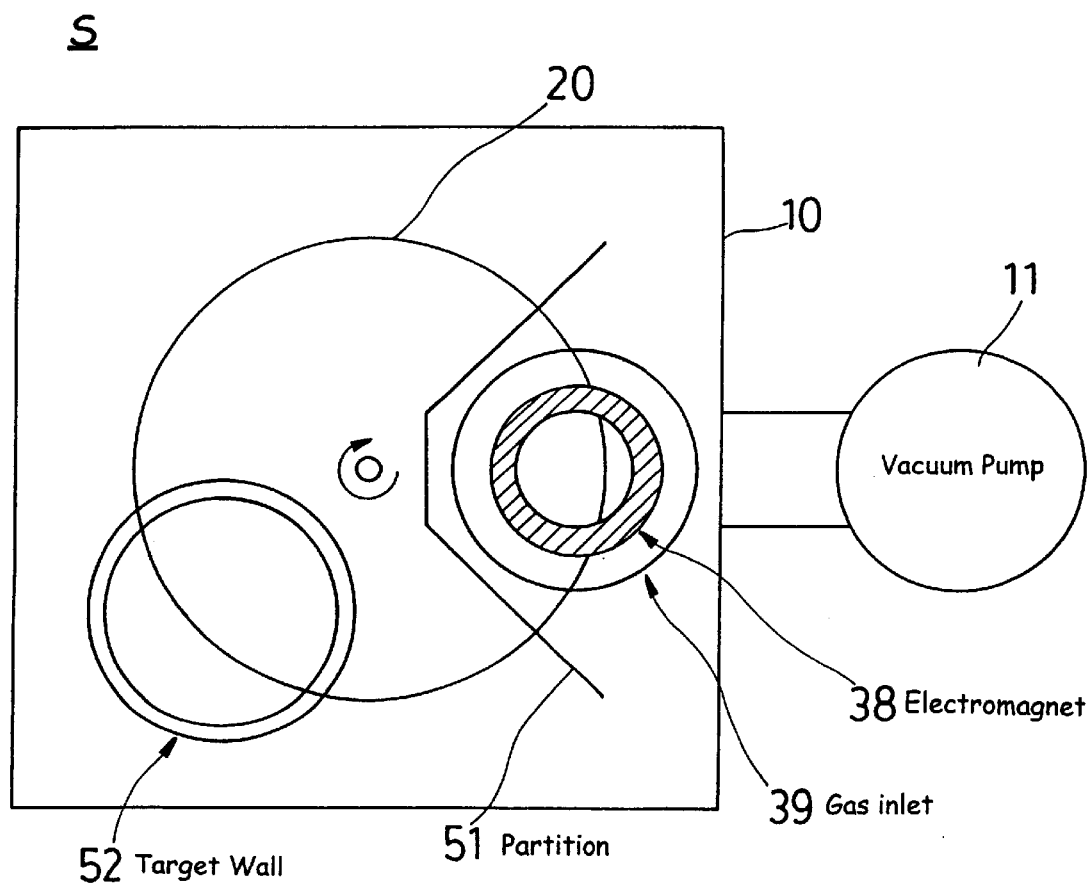
FIG. 4 is a schematic plane view of a parallel-plane-type apparatus for forming a thin film according to the present invention employing a CVD apparatus and a high-frequency sputtering apparatus.
Figure 5:
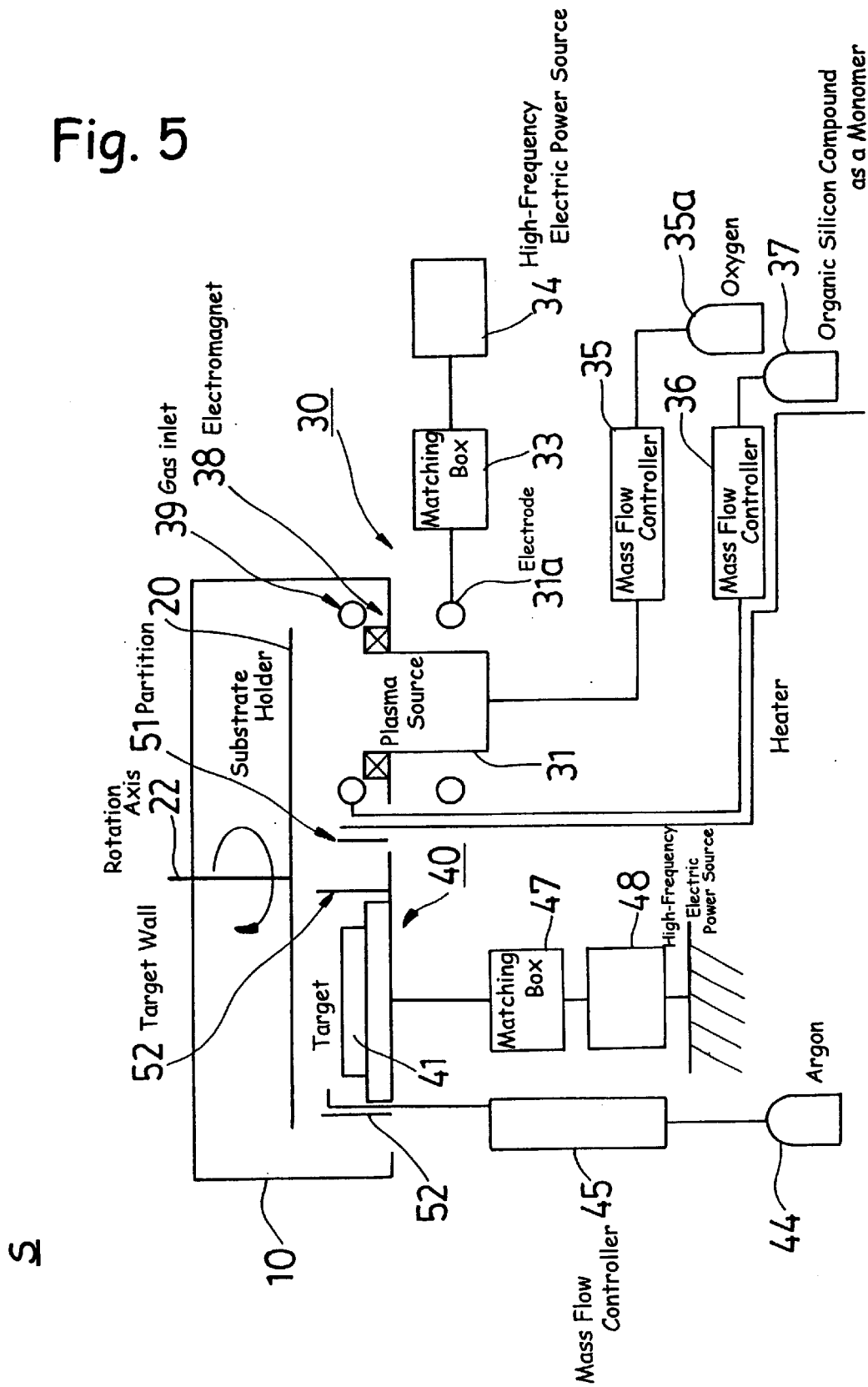
FIG. 5 is a schematic sectional view of the apparatus for forming a thin film shown in FIG. 4.

FIGS. 4 and 5 show another embodiment of the parallel-plane type film-forming apparatus, in which a CVD apparatus and a high-frequency sputtering apparatus are used in combination. FIG. 4 shows a schematic plan view of the thin-film forming apparatus, and FIG. 5 shows a schematic cross section of the apparatus. The target material employed in the present embodiment is $Ta_2O_5$, $TiO_2$, $ZrO_2$, $HfO_2$, $SiO_2$, $Al_2O_3$, or $Nb_2O_5$.

In contrast to the case shown in FIGS. 2 and 3, which is drawn to a sputtering apparatus making use of DC power source, the present embodiment makes use of a high-frequency power source. That is, according to the present embodiment, the sputtering apparatus 40 is connected to a high-frequency electric power source 48 via a target 41 and a matching box 47. Other portions of this embodiment are essentially the same as those shown in FIGS. 2 and 3.

Figure 6:
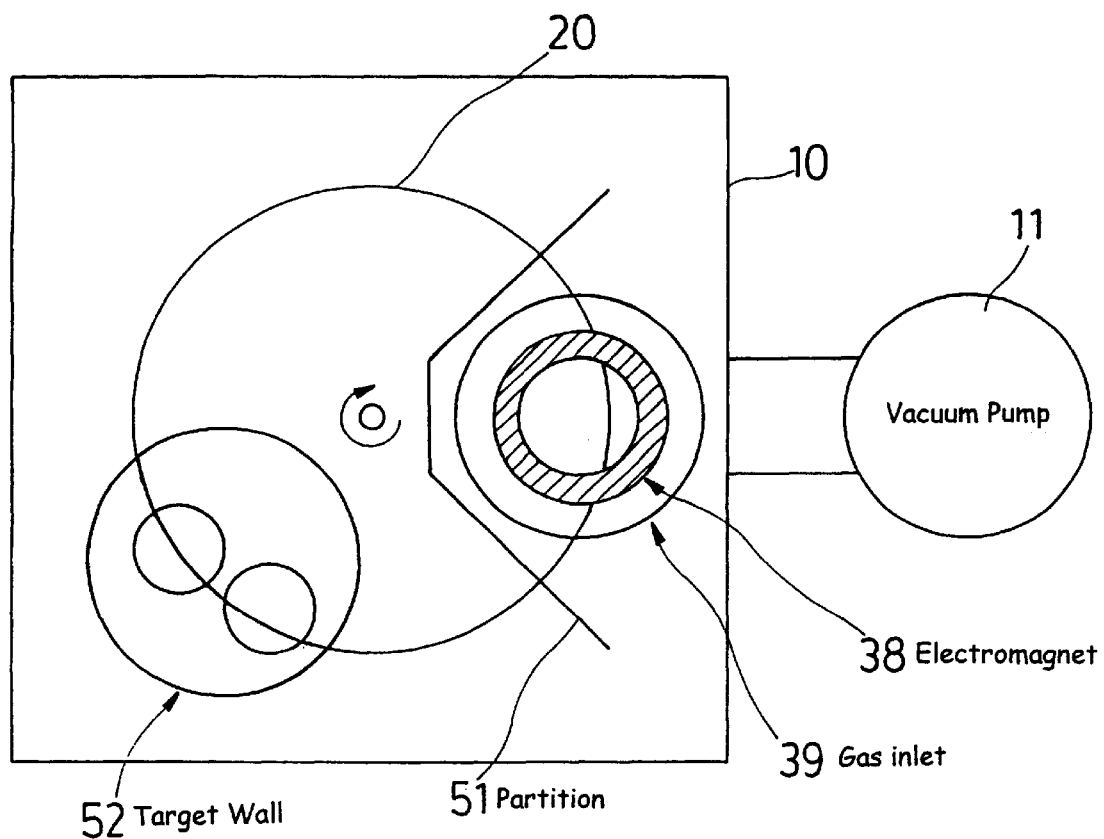
FIG. 6 is a schematic plane view of a parallel-plane-type apparatus for forming a thin film according to the present invention employing a CVD apparatus and a dual sputtering apparatus using an AC power source.
Figure 7:
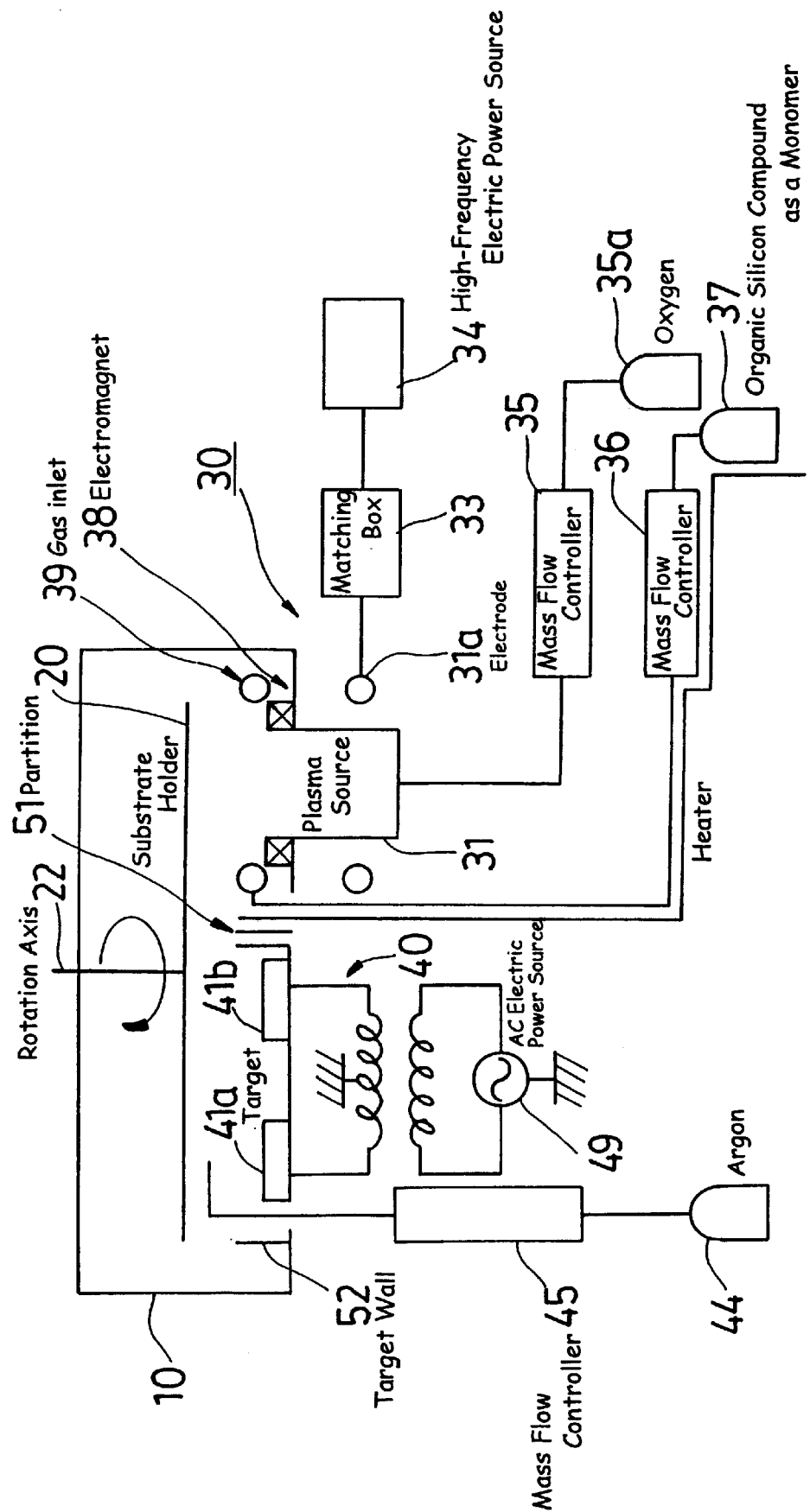
FIG. 7 is a schematic sectional view of the apparatus for forming a thin film shown in FIG. 6.

FIGS. 6 and 7 show still another embodiment of the parallel-plane type film-forming apparatus, in which a CVD apparatus and an AC power source for dual sputtering are used in combination. FIG. 6 shows a schematic plan view of the thin-film forming apparatus, and FIG. 7 shows a schematic cross section of the apparatus. In the present embodiment, the target material employed is Ta, Ti, Zr, Hf, Si, Al, or Nb.

The present embodiment employs a so-called dual sputtering apparatus, in which two targets and an AC power source are used. Incorporation of the dual sputtering apparatus distinguishes the present embodiment from the embodiment shown in FIGS. 2 and 3 and the embodiment shown in FIGS. 4 and 5. Other components in this embodiment are similar to those shown in FIGS. 2 and 3, or FIGS. 4 and 5.

More specifically, the sputtering apparatus of the present embodiment comprises, at a position facing a substrate holder 20 in a vacuum container, two sputtering electrodes 41a and 41b, and a CVD apparatus 30. The CVD apparatus 30 may have a structure similar to that described in relation to the previous embodiments.

Next, a description will be given of the aforementioned dual sputtering apparatus, taking dual magnetron sputtering as an example. When dual magnetron sputtering is performed, targets and a pair of sputtering electrodes (not shown) electrically insulated from ground potential are used. Therefore, although not shown, the sputtering electrodes and targets 41a and 41b are connected to the main body of the apparatus, which is grounded (vacuum container 10) by the mediation of an insulating material. One sputtering electrode and the target 41a are electrically isolated from the other sputtering electrode and the target 41b.

When an actuating gas such as argon gas is introduced to thereby suitably adjust a sputtering atmosphere, and power is supplied to the sputtering electrodes from an AC power source 49 through a transformer (not shown), an alternating field is always applied to the targets 41a and 41b. That is, at some point of time, the target 41a serves as a cathode (negative electrode), when the target 41b inevitably serves as an anode (positive electrode). This situation changes at the next point of time such that the direction of the alternating current reverses, making the target 41b serve as a cathode (negative electrode) and the target 41a serve as an anode (positive electrode).

Thus, the two targets 41a and 41b alternately serve as an anode and a cathode to thereby form plasma, by which the target on the cathode is sputtered to form an ultra-thin metal film on the substrate. At this time, non-conductive or low-conductive insufficiently reacted compound film may be formed on the anode. However, when the anode becomes a cathode due to the alternating field, such a insufficiently reacted compound film is removed by sputtering, making the target surface clean as in the original state. Through repetition of this process, there can be constantly obtained a stable anode potential, preventing change in plasma potential (in general, plasma potential is almost equal to the anode potential), to thereby enable formation of an ultra-thin metal film in a reliable manner.

Also, even in the case in which a target wall 52 is employed to isolate a process zone for forming film by sputtering, and reactive oxygen or the like migrates into the film-formation zone from a zone with a partition 51 to thereby temporarily form an oxide on the targets 41a and 41b, a stable anode portion can be obtained due to dual sputtering making use of an alternating field. As a result, film can be formed with good reproducibility.

The metal species that form the targets 41a and 41b may be the same or different. When the two targets are formed of the same metal species, an ultra-thin metal film of a single metal species (for example Si) is formed, whereas when the targets are formed of different metal species, an ultra-thin film of an alloy is formed. Preferably, the frequency of the AC voltage applied to the targets 41a and 41b is 1–100 KHz.

Figure 8:
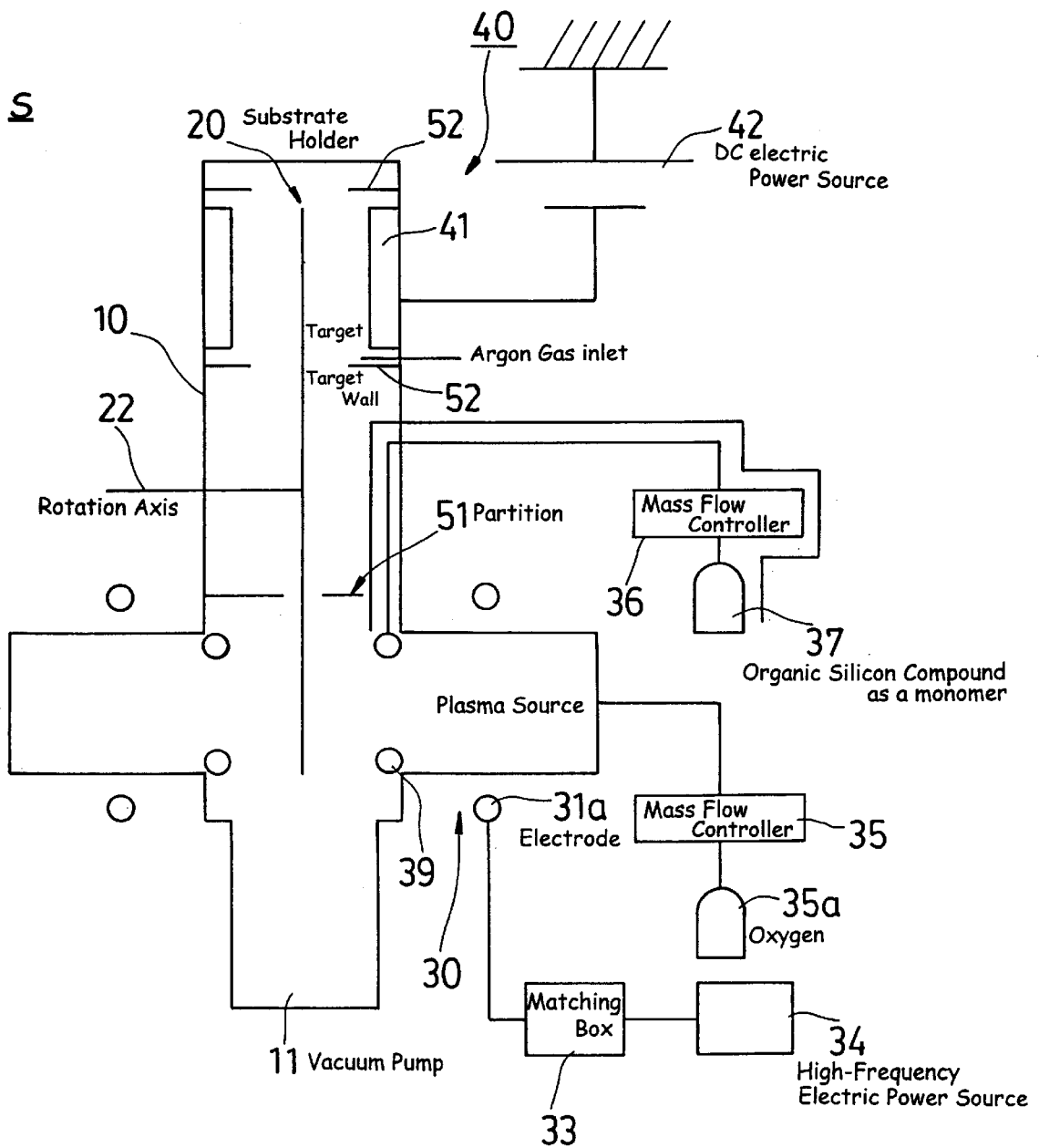
FIG. 8 is a schematic plane view of a parallel-plane-type apparatus for forming a thin film on both sides of a substrate wherein a plasma CVD apparatus and a sputtering apparatus are placed to either side of a rotating substrate holder.

FIG. 8 shows yet another embodiment of the parallel-plane type film-forming apparatus. The present embodiment is drawn to an apparatus for forming thin films on both sides of a substrate. As shown in FIG. 8, a plasma apparatus 30 and a sputtering apparatus 40 are arranged on the respective sides of the rotating substrate holder 20. In the present embodiment, the substrate holder 20 is upright and rotates about the rotation axis 22, in a plane vertical to the drawing sheet.

The sputtering apparatus 40 and the Plasma CVD apparatus 30 are provided on the respective sides of the substrate holder 20. The Plasma CVD apparatus 30 and the sputtering apparatus 40 are positioned such that they are located apart from each other. In the vacuum container 10, the plasma apparatus 30 is partitioned by a partition 51 and the sputtering apparatus 40 is partitioned by a target wall 52.

FIG. 8 shows an embodiment in which components for film formation are serially arranged mainly on the right side of the substrate holder. However, film can be formed on either the left or right side of the substrate holder 20, or on both sides thereof by use of, for example, a tube or a connection wire.

This structure brings an advantage of enabling film formation on both sides simultaneously and facilitation of load-locking. Also, the sputtering apparatus which can be used in the present embodiment is not limited only to a DC sputtering apparatus; alternatively there can be employed various types of apparatus as described hereinabove, such as a high-frequency sputtering apparatus, a dual sputtering apparatus making use of an AC power source, etc.

Figure 9:
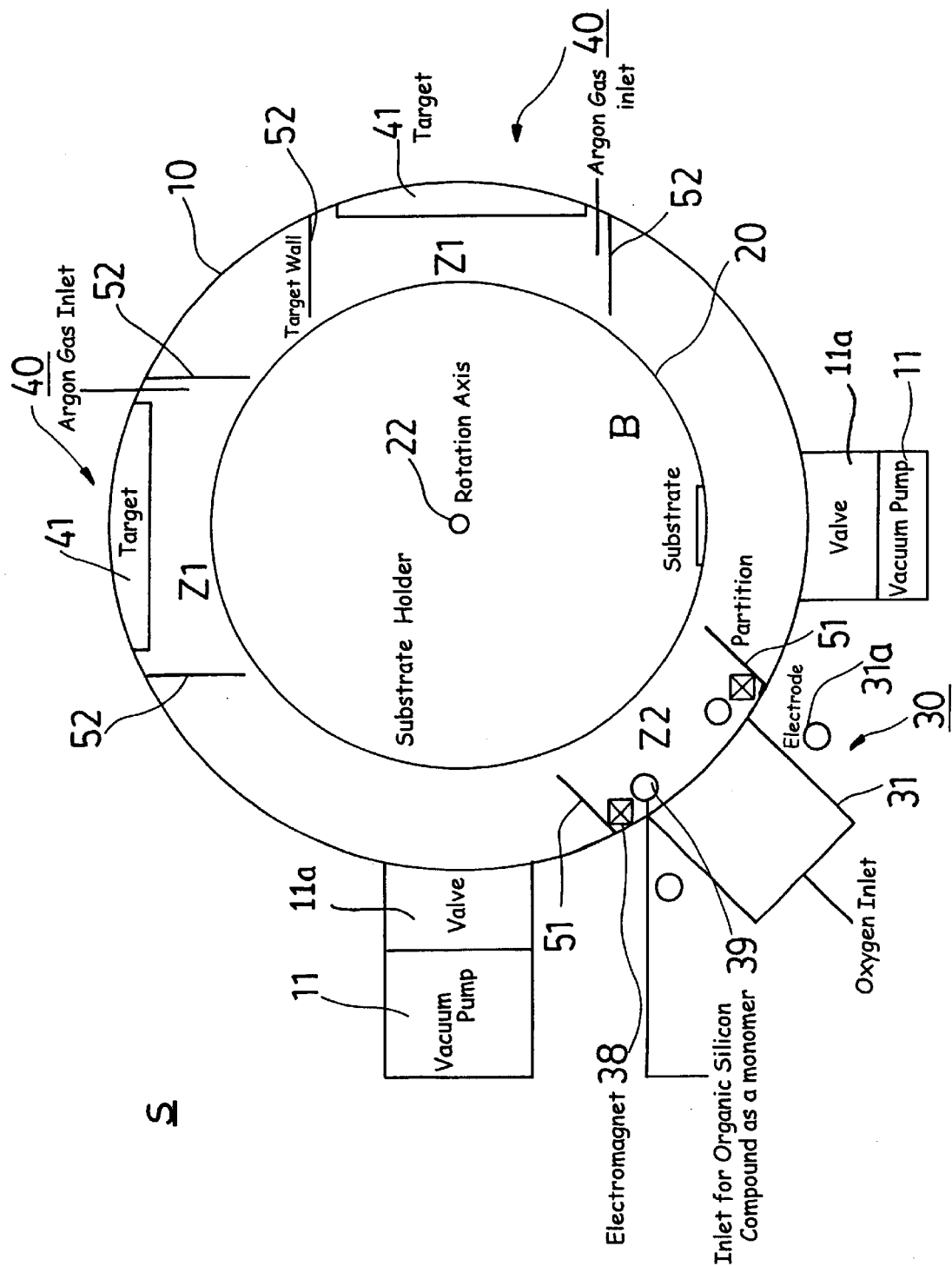
FIG. 9 is a schematic plane view of a rotating-drum-type apparatus for forming a thin film according to the present invention.
Figure 10:
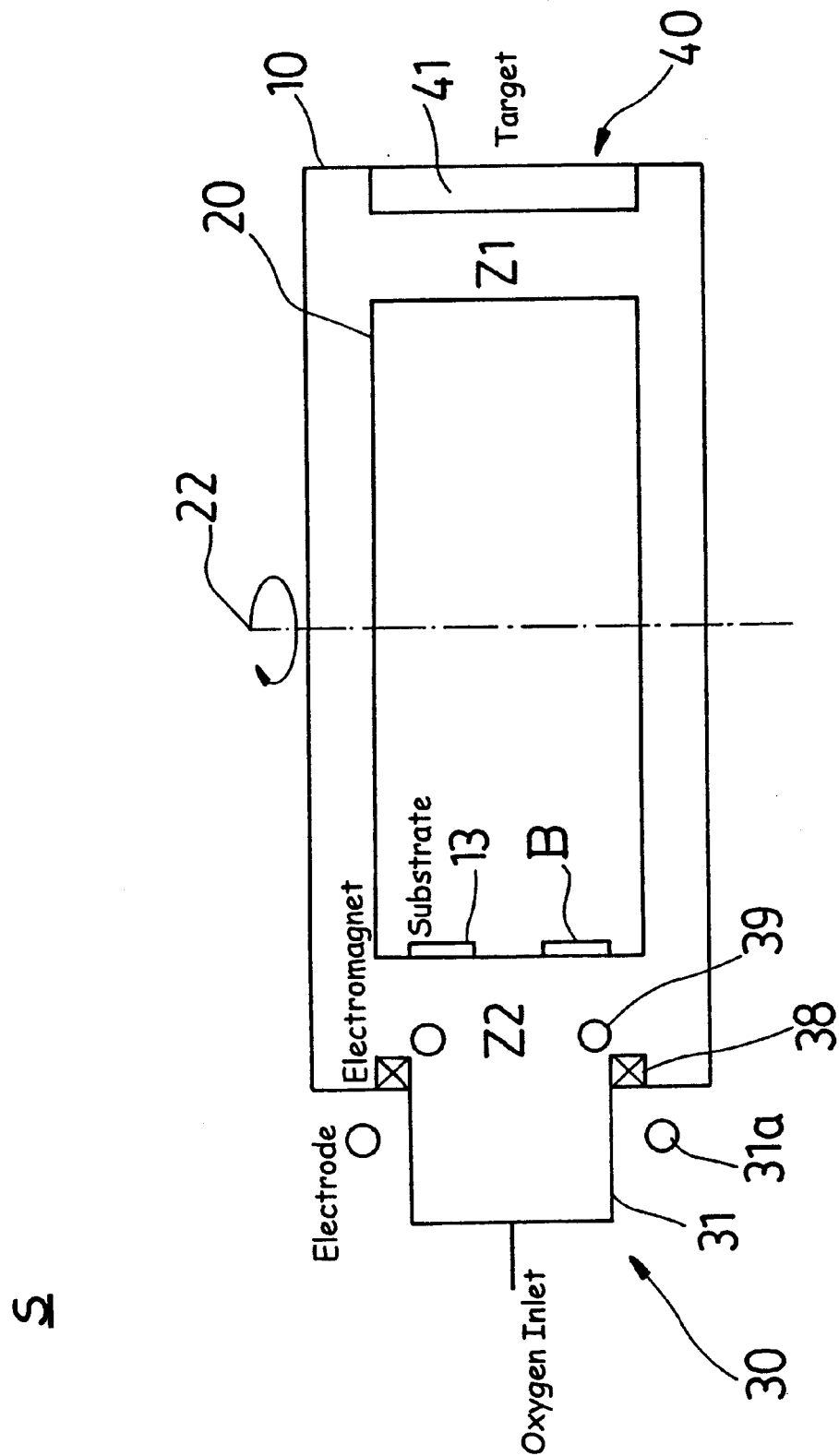
FIG. 10 is a schematic sectional view of the apparatus for forming a thin film shown in FIG. 9.

FIGS. 9 and 10 show a rotary-drum-type thin-film forming apparatus. FIG. 9 shows a schematic plan view of the apparatus, and FIG. 10 shows a schematic cross section of the apparatus. As shown in FIG. 9, the thin-film forming apparatus S of the present embodiment comprises, as its primary components, a vacuum container 10, film forming zones Z1 making use of sputtering apparatus 40, another film forming zone Z2 making use of a CVD apparatus 30, shielding means (in the present embodiment, partitions 51 and target walls 52), conveyor means (in the present embodiment, a substrate holder 20 and a driving mechanism therefor), and vacuum apparatus (vacuum pumps 11 and valves 11a).

According to the present embodiment, the vacuum apparatus 10 comprises a hollow, sealed container whose shape is not particularly limited. At the center of the vacuum container is provided, as conveyor means, a generally hollow cylindrical substrate holder 20, which can rotate at a predetermined speed. A substrate B is placed on the substrate holder 10. In the vacuum apparatus 10, film forming zones Z1 making use of a sputtering apparatus 40 and another film forming zone Z2 making use of a CVD apparatus 30 are provided such that they surround the substrate holder 20.

The film forming zones Z1 making use of a sputtering apparatus 40 are individually and independently surrounded by target walls 52, so as to enable at least two independent sputtering operations. The structure of the sputtering apparatus per se may be identical to that in other embodiments already described hereinabove. Therefore, reiterate description will be omitted.

The film forming zone Z2 related to the CVD apparatus 30 is located at a position a predetermined distance apart from each of the film-forming zones Z1 with the substrate holder 20 being placed between Z1 and Z2. The film-forming zone Z2 is shielded by partitions 51 which serve as shielding means (separation means) such that Z2 is enclosed within a certain area. The structure of the CVD apparatus 30 itself may be any one of the aforementioned corresponding structures, and thus, a reiterate description will be omitted.

The film-forming zone Z1 related to the sputtering apparatus 40 and the film-forming zone Z2 related to the CVD apparatus 30 respectively define separate spaces in a vacuum atmosphere. That is, although not completely separated, the vacuum chamber 10 is divided to form semi-isolated film-forming zones Z1 and Z2, which can be controlled independently. Therefore, the film-forming zone Z1 related to the sputtering apparatus 40 and the film-forming zone Z2 related to the CVD apparatus 30 undergo minimal mutual influence, to thereby enable independent setting of optimum conditions for respective chambers. In addition, the apparatus as shown in FIGS. 9 and 10 is suitable for large-scale manufacturing, because substrates having a large surface area can be processed.

Figure 11:
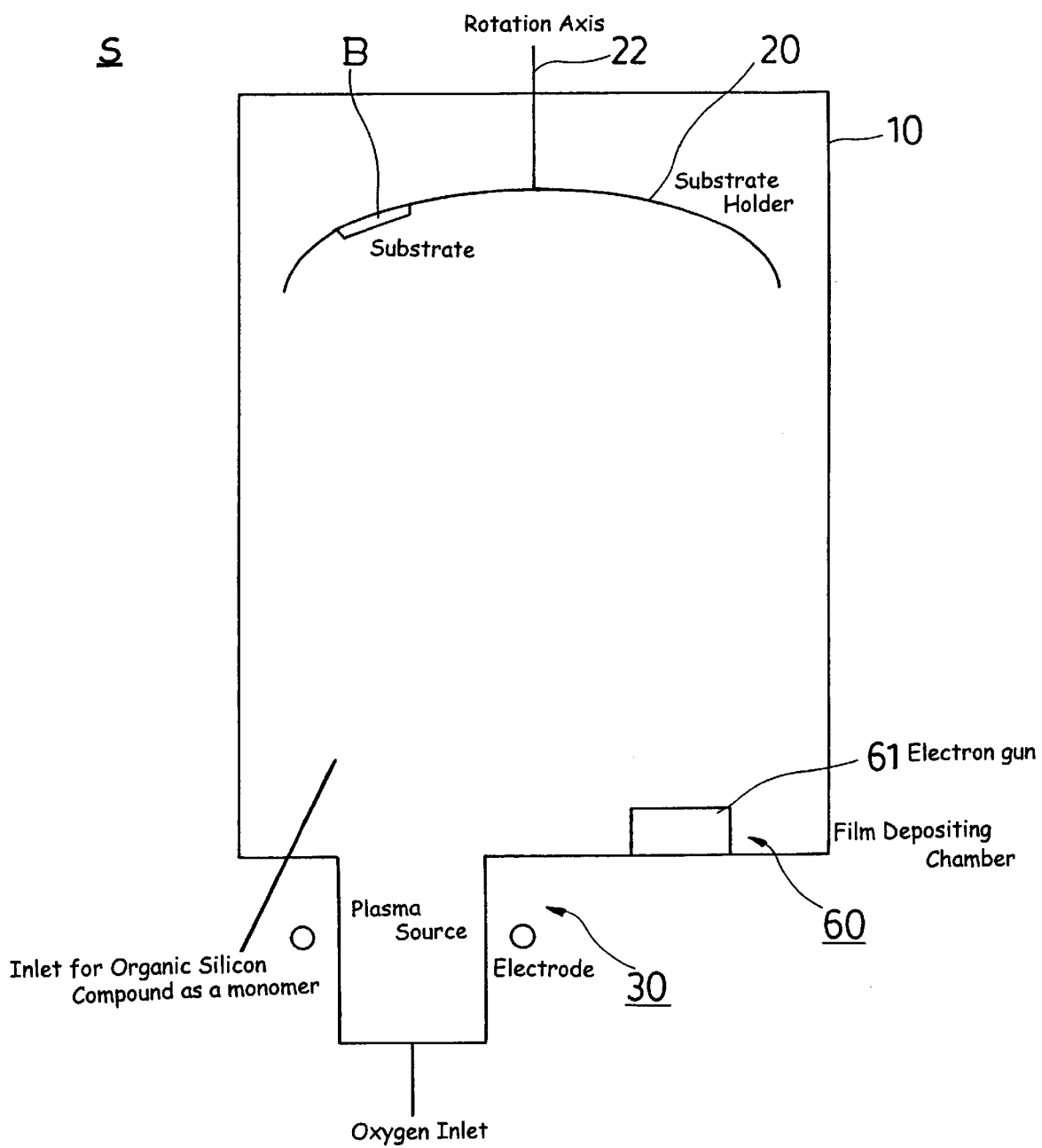
FIG. 11 is a schematic plane view of a dome-type apparatus for forming a thin film employing a vapor deposition apparatus and a sputtering apparatus.

FIG. 11 shows an embodiment of the dome-type film-forming apparatus of the present invention, in which a vapor deposition apparatus and a sputtering apparatus are incorporated in combination. In the present embodiment, as shown in FIG. 11, the film-forming apparatus comprises a dome-shaped substrate holder 20, which can be rotated around a rotation axis 22. The dome-like substrate holder 22 holds a substrate B, and at a position opposing the substrate B are provided a CVD apparatus 30 and a deposition apparatus 60.

The CVD apparatus 30 in the present embodiment has a structure similar to that described for the previously mentioned embodiments, and therefore, a reiterate description will be omitted. The vapor deposition apparatus 60 is constructed such that an evaporation material placed in an cooled crucible, not illustrated, is directly irradiated for heating by an electron beam from an electron gun 61 placed in the vacuum chamber 10.

Figure 12:
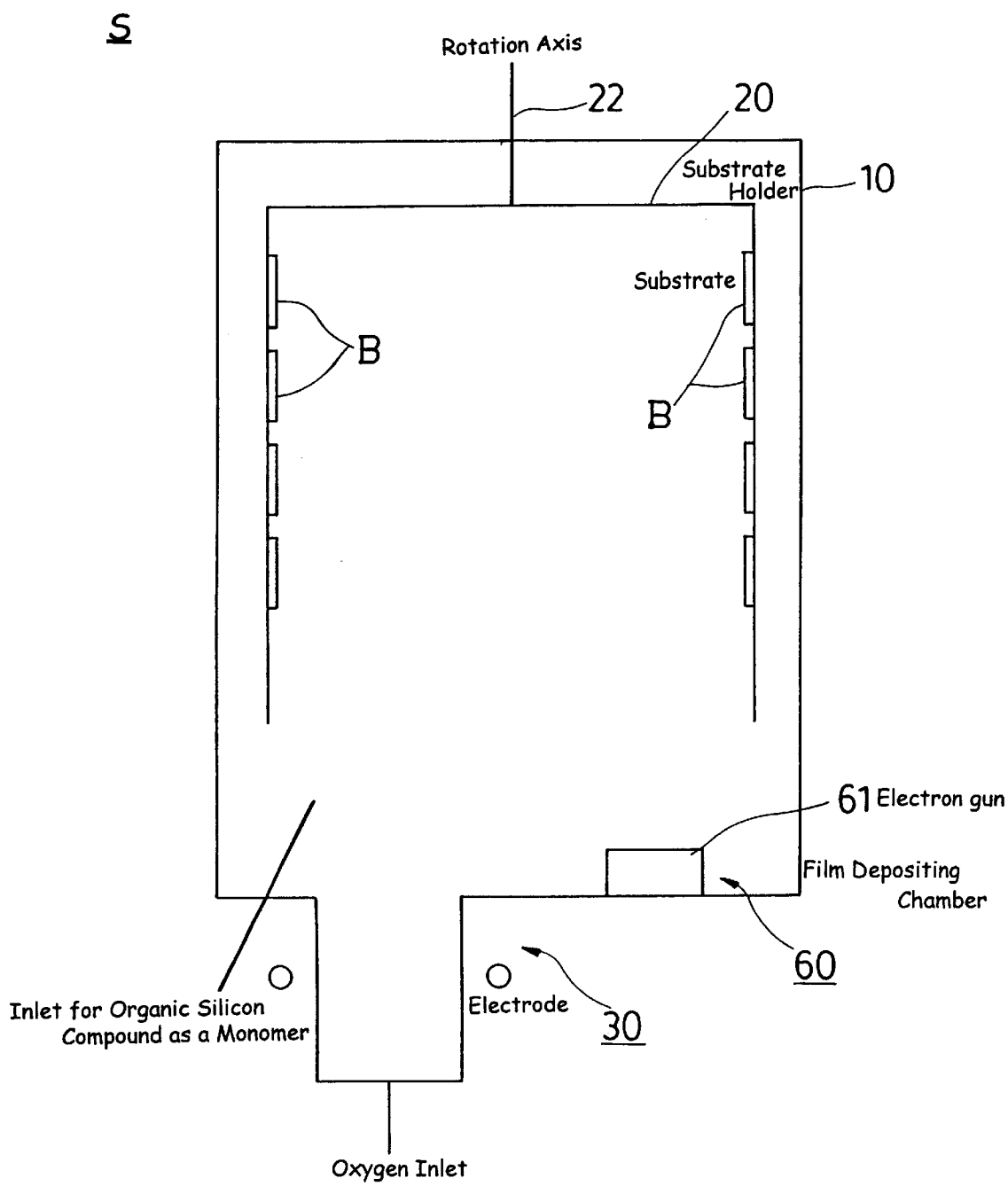
FIG. 12 is a schematic plane view of a drum-type apparatus for forming a thin film employing a vapor deposition apparatus and a sputtering apparatus.

FIG. 12 shows an embodiment of the drum-type film-forming apparatus of the present invention, in which a vapor deposition apparatus 60 and a sputtering apparatus 30 are incorporated in combination. The present embodiment differs from the embodiment shown in FIG. 11 in that the present apparatus has a drum-shaped substrate holder in contrast to the case of FIG. 11 in which the substrate holder 20 has a dome shape. In the present embodiment, a substrate B is held on the inner surface of the drum. The drum-shape substrate holder 20 is rotatable around a rotation axis 22.

In the embodiments shown in FIGS. 11 and 12, there may be used the following materials as an evaporation source. That is, Si, Ta, Ti, Zr, Hf, Al, or Nb may be used as a target material of a DC or AC sputtering source; and $SiO_2$, $TaO_5$, $TiO_2$, $ZrO_2$, $HfO_2$, or $Al_2O_3$ may be used as an RF sputtering source. Also, Si or Ta may be used to perform resistance evaporation, and Si, Ta, $SiO_2$, $Ta_2O_5$ may be used to perform electron beam deposition.

In order to perform plasma enhanced CVD, the following plasma source may be used. For example, in the case of high-frequency CVD, there may be employed an inductively coupled plasma (ICP) source, a magnetic field enhanced inductively coupled plasma source, a capacitive coupling plasma source, a magnetic field enhanced coupled plasma source, or a helical plasma source.

When a microwave is used, there may be used a microwave plasma source or an ECR plasma source; and in the case of an ion source, there may be used a Kauffmann-type ion source or an RF-type ion source; and in the case of an HCD, there may be used an HCD plasma source.

What is claimed is:

1. An apparatus for forming a thin film comprising:
    a single vacuum chamber;
    a vacuum apparatus connected to the vacuum chamber;
    a holder placed within the vacuum chamber, which holder provides a planar rotatable surface for holding a substrate and is rotated within a plane of rotation by means of a rotating mechanism;
    a plasma CVD apparatus for depositing a first material of a first refractive index on said substrate; and
    a sputtering apparatus for depositing a second material of a second refractive index on said substrate;
    wherein both the plasma CVD apparatus and the sputtering apparatus are positioned in said single vacuum chamber, facing said planar rotatable surface and said plane of rotation, for simultaneously depositing said first and second materials to form the thin film with an intermediate refractive index intermediate said first and second refractive indices on the substrate held by the holder.

2. The apparatus according to claim 1, wherein the apparatus is a parallel-plane, drum, rotary-drum, or dome apparatus.

3. The apparatus according to claim 1, wherein regions of the CVD apparatus and the sputtering apparatus are separated by a partition.

4. The apparatus according to claim 1, wherein the plasma CVD apparatus comprises a plasma source, a mass flow controller for feeding a monomer, an electric power source comprising a matching box connected to a high-frequency electric power source, and a mass flow controller for feeding a reactive gas, wherein an organic silicon compound serving as a monomer is activated in a portion apart from the plasma source in a plasma atmosphere, to thereby deposit said first material on the substrate.

5. The apparatus according to claim 4, wherein the plasma source is selected from among diatomic oxygen ($O_2$), dinitrogen oxide ($N_2O$), and ozone ($O_3$).

6. The apparatus according to claim 1, wherein the sputtering apparatus quantitatively feeds particles having the second refractive index onto the first material formed by means of the plasma CVD apparatus.

7. The apparatus according to claim 1, wherein a target wall is formed around a target and a gas-supplying portion contained in the sputtering apparatus.

8. The apparatus according to claim 1, wherein the sputtering apparatus employs at least two different kinds of sputtering targets.

9. The apparatus according to claim 1, wherein the plasma CVD apparatus is a remote plasma CVD apparatus.

10. The apparatus according to claim 1, wherein the sputtering apparatus is a vapor deposition apparatus.

11. The apparatus according to claim 1, wherein the substrate is formed of plastic material.

12. The apparatus according to claim 1, wherein the intermediate refractive index is 1.46–2.22.

13. A method for forming a thin film on a substrate, which method comprises:
    rotating said substrate within a plane of rotation;
    depositing a first material of a first refractive index on said rotating substrate through plasma CVD; and
    quantitatively feeding particles of a second refractive index onto said rotating substrate through sputtering, said depositing and said feeding being carried out simultaneously in the same single chamber, at positions facing said plane of rotation and different from one another, to thereby form on the substrate the thin film with an intermediate refractive index intermediate said first and second refractive indices.

14. The method according to claim 13, wherein sputtering is carried out by use of at least two different kinds of sputtering targets.

15. The method according to claim 13, wherein the plasma CVD is carried out through remote plasma CVD.

16. The method according to claim 13, wherein the sputtering is carried out through vapor deposition.

17. The apparatus according to claim 13, wherein the intermediate refractive index is 1.46–2.22.

18. A method for forming a thin film on a substrate, which method comprises:

rotating said substrate within a plane of rotation;

depositing a first material of a first refractive index on said rotating substrate, through plasma CVD attained by activating an organic silicon compound as a monomer in a plasma atmosphere; and quantitatively feeding, through sputtering, particles comprising a metal oxide or a multi-component metal oxide of a second refractive index onto said rotating substrate, said depositing and said feeding being carried out simultaneously in the same single chamber, at positions facing said plane of rotation and different from one another, to thereby form on the substrate the thin film with an intermediate refractive index intermediate said first and second refractive indices.

19. Thee method according to claim 18, wherein the organic silicon compound comprises:

an organic silane having an alkyl group, an allyl group, a vinyl group, or a phenyl group and including tetramethylsilane ($Si(CH_3)_4$), tetraethylsilane ($Si(C_2H_5)_4$), ethyltrimethylsilane ($Si(C_2H_5)(CH_3)_3$), allyltrimethylsilane ($CH_2=CHCH_2)Si(CH_3)_3$), phenyltrimethylsilane (($C_6H_5)Si(CH_3)_3$), or hexamethyldisilane (($CH_3)_3SiSi(CH_3)_3$);

an alkoxysilane including tetramethoxysilane ($Si(OCH_3)_4$), tetraethoxysilane ($Si(OC_2H_5)_4$), dimethyldiethoxysilane ($Si(OCH_3)_2(OC_2H_5)_2$), or ethoxytrimethylsilane ($Si(OC_2H_5)(CH_3)_3$);

a siloxane including hexamethyldisiloxane (($CH_3)_3SiOSi(CH_3)_3$) or octamethyltrisiloxane (($CH_3)_3SiOSi(CH_3)_2OSi(CH_3)_3$); and a halosilane including tetrachlorosilane ($SiCl_4$).

20. The method according to claim 18, wherein the sputtering is carried out by use of at least two different kinds of sputtering targets.

21. The method according to claim 18, wherein the plasma CVD is carried out through remote plasma CVD.

22. The method according to claim 18, wherein the sputtering is carried out through vapor deposition.

23. The apparatus according to claim 18, wherein the intermediate refractive index is 1.46–2.22.

* * * * *

UNITED STATES PATENT AND TRADEMARK OFFICE
CERTIFICATE OF CORRECTION

PATENT NO.    : 6,287,430 B1
DATED         : September 11, 2001
INVENTOR(S)   : Matsumoto et al.

It is certified that error appears in the above-identified patent and that said Letters Patent is hereby corrected as shown below:

<u>Column 8,</u>
Table 1, under the heading "Voltage (v)", line 3, "664" should read -- 564 --; and
Table 2, under the heading "Reflective Index (550 nm)", line 2, "1.498" should read -- 1.4598 -- .

Signed and Sealed this

Fourth Day of June, 2002

*Attest:*

*Attesting Officer*

JAMES E. ROGAN
*Director of the United States Patent and Trademark Office*